United States Patent
Ishida et al.

[11] Patent Number: 6,013,951
[45] Date of Patent: Jan. 11, 2000

[54] SEMICONDUCTOR DEVICE HAVING AN IMPROVED LEAD CONNECTION STRUCTURE AND MANUFACTURING METHOD THEREOF

[75] Inventors: Tomohiro Ishida; Shigeru Harada; Takashi Yamashita, all of Tokyo, Japan

[73] Assignee: Mitsubishi Denki Kabushiki Kaisha, Tokyo, Japan

[21] Appl. No.: 09/116,242

[22] Filed: Jul. 16, 1998

[30] Foreign Application Priority Data

Jan. 26, 1998 [JP] Japan ................................. 10-012561

[51] Int. Cl.[7] ........................... H01L 23/48; H01L 23/52; H01L 29/40
[52] U.S. Cl. .......................... 257/750; 257/774; 257/758; 257/621
[58] Field of Search .................... 257/750, 774, 257/758, 621

[56] References Cited

U.S. PATENT DOCUMENTS

| | | | |
|---|---|---|---|
| 3,585,461 | 6/1971 | Eynon et al. | 257/784 |
| 3,831,068 | 8/1974 | Kniepkamp | 257/774 |
| 4,291,322 | 9/1981 | Clemens et al. | 257/758 |
| 5,017,510 | 5/1991 | Welch et al. | 438/622 |
| 5,387,812 | 2/1995 | Forouhi et al. | 257/758 |
| 5,476,814 | 12/1995 | Ohshima et al. | 438/622 |
| 5,894,170 | 4/1999 | Ishikawa | 257/774 |

FOREIGN PATENT DOCUMENTS 6-283612  10/1994  Japan.

Primary Examiner—Mahshid Saadat
Assistant Examiner—Jhihan B Clark
Attorney, Agent, or Firm—McDermott, Will & Emery

[57] ABSTRACT

A first polycide lead, which is formed on a silicon substrate, consists of a first doped polysilicon layer and a first tungsten silicide layer that is formed on the first doped polysilicon layer. An interlayer insulating film, which is formed on the silicon substrate, has an opening that reaches the first doped polysilicon layer. A second polycide lead, which is formed on the interlayer insulating film, consists of a second doped polysilicon layer that is connected to the first polycide lead in the opening and a second tungsten silicide layer that is formed on the second doped polysilicon layer. In the opening, the first and second doped polysilicon layers are in contact with each other at the side surfaces of the first polycide lead.

20 Claims, 5 Drawing Sheets

SEMICONDUCTOR DEVICE HAVING AN IMPROVED LEAD CONNECTION STRUCTURE AND MANUFACTURING METHOD THEREOF

BACKGROUND OF THE INVENTION

1. Field of the Invention

The present invention relates to a semiconductor device and a manufacturing method thereof. In particular, the present invention relates to a wiring connection structure of a semiconductor integrated circuit device in which a silicon layer, such as a doped polysilicon layer or a doped amorphous silicon layer, and a metal silicide layer or a metal layer are connected to each other in a connection hole.

2. Background Art

In semiconductor devices, circuit elements such as transistors are usually formed on a semiconductor substrate. Various kinds of interconnections are formed on a semiconductor substrate to electrically connect between the internal circuit elements as well as to electrically connect the circuit elements to external circuits. Among various kinds of interconnections, the polycide lead which consists of a doped polysilicon layer, to which an impurity such as phosphorus is added to reduce resistance, and a metal silicide layer such as a tungsten silicide layer is used for various kinds of interconnections as typified by a gate electrode because of its relatively low wiring resistance and superior heat resistance. With recent increases in integration densities and operation speeds of semiconductor devices, it is increasingly desired to connect between polycide leads each other with as low a contact resistance as possible.

Figure 9:
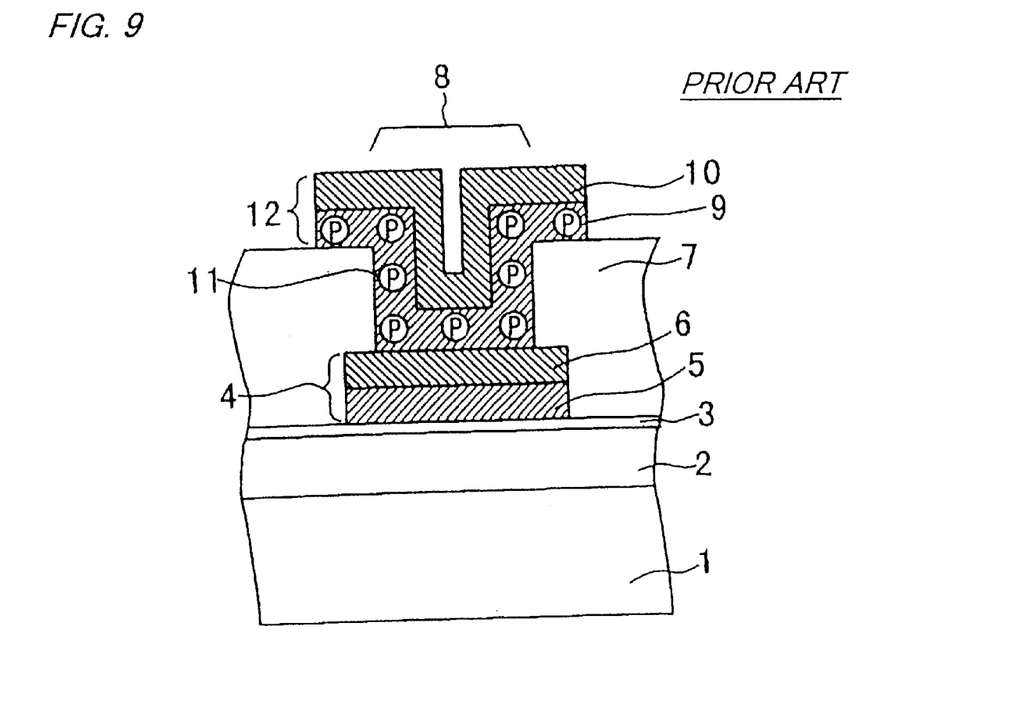
FIGS. 9 and 10 are sectional views showing a conventional semiconductor device respectively.

FIG. 9 is a sectional view showing a conventional semiconductor device, particularly an example of a connection between its polycide lead layer.

As shown in FIG. 9, an underlying insulating film 2 is formed on a silicon substrate 1, and a gate insulating film 3 is formed on the underlying insulating film 2. A first polycide lead layer 4 is formed on the gate insulating film 3. The first polycide lead layer 4 consists of a first doped polysilicon layer 5 and a first tungsten silicide layer 6.

After an interlayer insulating film 7 is formed on the gate insulating film 3 so as to cover the first polycide layer 4, an opening 8 is formed through the interlayer insulating film 7 so as to reach the top of the first tungsten silicide layer 6 of the first polycide lead layer 4. A second polycide lead layer 12 consisting of a second doped polysilicon layer 9 and a second tungsten silicide layer 10 is connected to the first polycide lead layer 4 in the opening 8. The first and second polycide lead layers 4 and 12 are connected to each other substantially through contact between the first tungsten silicide layer 6 and the second doped polysilicon layer 9.

To reduce the contact resistance between the first and second polycide lead layers 4 and 12, the second doped polysilicon layer 9 is doped with phosphorus atoms 11. A semiconductor device including the above structure will be subjected to subsequent various heat treatment steps to be completed as a final product.

In the conventional semiconductor device including the above structure, there occurs, in the opening 8, a phenomenon that the phosphorus atoms 11 that are added in the second doped polysilicon layer 9 diffuse into the first tungsten silicide layer 6 in each heat treatment step of the manufacturing process.

As a result, a portion of the second doped polysilicon layer 9 near the interface with the first polycide lead layer 4, from which portion the phosphorus atoms 11 have escaped, comes to have high resistivity. Further, the contact between the second doped polysilicon layer 9 and the first tungsten silicide layer 6 makes a transition from ohmic contact to Schottky contact, because the difference in work function increases as the concentration of the phosphorus atoms 11 in the second doped polysilicon layer 9 decreases.

For the above reasons, the semiconductor device including the structure of FIG. 9 has a problem that the contact resistance between the first and second polycide lead layers 4 and 12 is very high.

Figure 10:
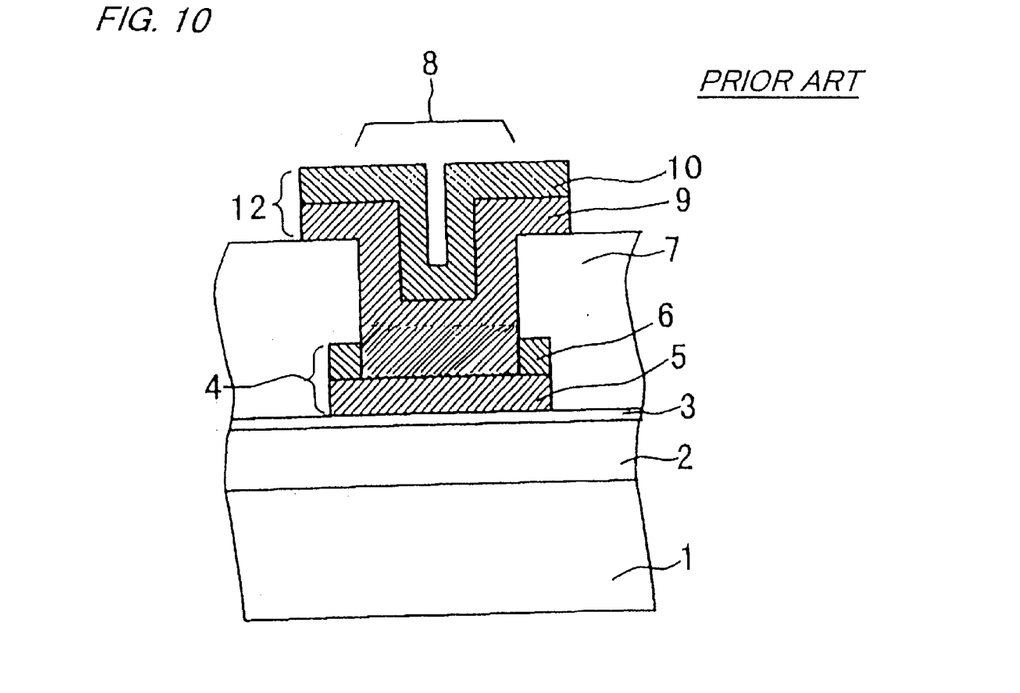

FIG. 10 is a sectional view showing an example of a conventional semiconductor device in which the above-mentioned problem is solved.

As shown in FIG. 10, an opening 8 penetrates through the first tungsten silicide layer 6 of the first polycide lead 4, and the first and second polycide lead layers 4 and 12 are connected to each other through contact between the first and second doped polysilicon layers 5 and 9.

In this structure, the phosphorus atoms 11 do not move between the first and second doped polysilicon layers 5 and 9 if the difference in phosphorus concentration between the first and second doped polysilicon layers 5 and 9 is made small. Therefore, the contact resistance remains low.

However, to realize the semiconductor device including the structure of FIG. 10, in forming the opening 8 both of the interlayer insulating film 7 and the first tungsten silicide layer 6 need to be etched.

However, there is a problem that according to the current etching technology there is great technological difficulty in forming an opening through both of the interlayer insulating film 7 and the first tungsten silicide layer 6 by a single etching step.

On the other hand, if openings are formed in the interlayer insulating film 7 and the first tungsten silicide layer 6 by separate etching steps, there arises a problem that the manufacturing cost increases.

SUMMARY OF THE INVENTION

The present invention has been made to solve the above problems, and an object of the present invention is therefore to provide a semiconductor device and its manufacturing method which can realize a low contact resistance connection between polycide lead layers simply and easily at a low cost.

According to one aspect of the present invention, a semiconductor device comprises a first lead formed on said semiconductor substrate and comprises a plurality of wiring layers. An interlayer insulating film is formed on said semiconductor substrate and has an opening that reaches at least a bottom layer of the plurality of wiring layers of said first lead. A second lead is formed on said interlayer insulating film and comprises a plurality of wiring layers. In said opening, a bottom layer of the plurality of wiring layers of said second lead is brought into contact with said bottom layer of the plurality of wiring layers of said first lead at a side surface of said first lead. Thus, Said second lead is connected to said first lead in said opening.

Said opening of said interlayer insulating film may be preferably wider than said first lead.

Alternatively, said opening of said interlayer insulating film may preferably includes a first opening that extends from the top surface of said interlayer insulating film to a top layer of the plurality of wiring layers of said first lead and a second opening that extends from said first opening to said bottom layer of the plurality of wiring layers of said first lead.

Alternatively, said opening of said interlayer insulating film may be formed to partially deviate from said first lead.

In another aspect of the present invention, in the semiconductor device, the plurality of wiring layers of said first lead include a first silicon layer and a first metal silicide layer formed on said first silicon layer, and the plurality of wiring layers of said second lead include a second silicon layer and a second metal silicide layer formed on said second silicon layer.

In the semiconductor device, each of said first and second silicon layers may preferably a doped polysilicon layer.

Alternatively, in the semiconductor device, each of said first and second silicon layers may preferably a doped amorphous silicon layer.

In another aspect of the present invention, in the semiconductor device, the plurality of wiring layers of said first lead include a first silicon layer and a first metal layer formed on said first silicon layer, and the plurality of wiring layers of said second lead include a second silicon layer and a second metal layer formed on said second silicon layer.

In another aspect, the semiconductor device may further comprises a SiN film or a SiON film formed under said first lead and on said semiconductor substrate.

In another aspect, in the semiconductor device, said SiN film or said SiON film may be a gate insulating film.

According ot another aspect of the present invention, in a manufacturing method of a semiconductor device, a first lead comprising a plurality of wiring layers is formed on a semiconductor substrate. An interlayer insulating film is formed so as to cover said first lead and said semiconductor substrate. An opening is formed through said interlayer insulating film so that said opening reaches a bottom layer of the plurality of wiring layers of said first lead. Finally, a second lead is formed in said opening and on said interlayer insulating film so as to connect said second lead to said first lead in said opening.

Other and further objects, features and advantages of the invention will appear more fully from the following description.

BEST MODE OF CARRYING OUT THE INVENTION

The embodiments of the present invention will be hereinafter described with reference to the accompanying drawings. In the drawings, the same reference numerals designate same or corresponding portions.

First Embodiment

Figure 1:
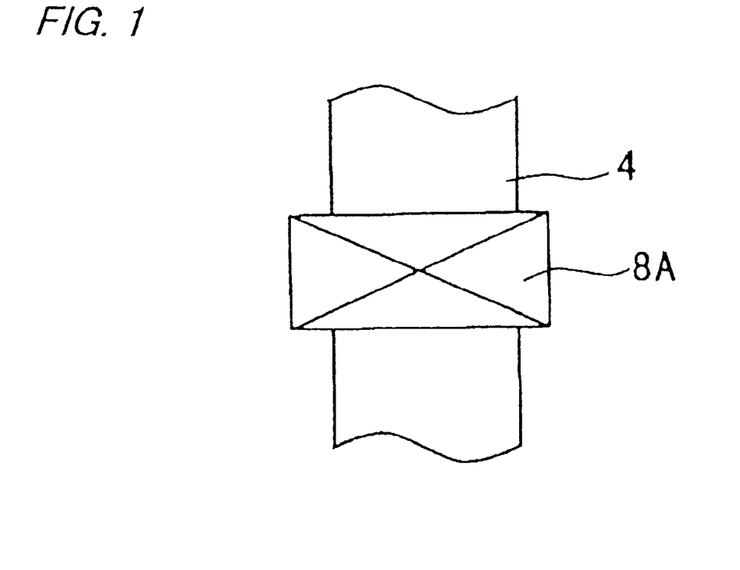
FIGS. 1 and 2 are a plan view and a sectional view, respectively, showing a semiconductor device according to a first embodiment of the present invention.
Figure 2:
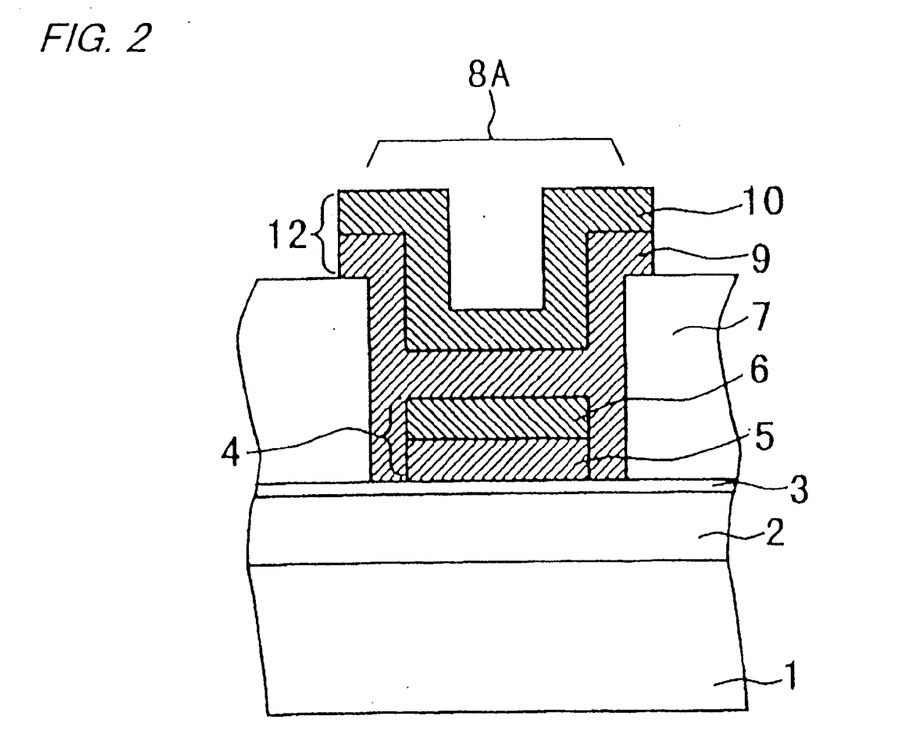

FIGS. 1 and 2 are a plan view and a sectional view, respectively, showing a semiconductor device according to a first embodiment of the present invention. The same reference numerals in FIGS. 1 and 2 and in FIG. 9 show the corresponding portions respectively.

As shown in FIGS. 1 and 2, an underlying insulating film 2 is formed on a silicon substrate 1, and a gate insulating film 3 is formed on the underlying insulating film 2. A first polycide lead 4 as a first lead is formed on the gate insulating film 3. The first polycide lead 4 consists of a plurality of wiring layers, for instance, a first doped polysilicon layer 5 as a first silicon layer and a first tungsten silicide layer 6.

After an interlayer insulating film 7 is formed on the gate insulating film 3 so as to cover the first polycide lead 4, an opening 8A is formed through the interlayer insulating film 7 so as to reach the gate insulating film 3, or the bottom level of the first doped polysilicon layer 5 of the first polycide lead 4. The width of the opening 8A is set larger than that of the first polycide lead 4.

A second polycide lead 12 is connected to the first polycide lead 4 in the opening 8A. The second polycide lead 12 consists of a plurality of wiring layers, for instance, a second doped polysilicon layer 9 as a second silicon layer and a second tungsten silicide layer 10.

The first and second polycide leads 4 and 12 are connected to each other by a contact between the top surface and the side surfaces of the first tungsten silicide layer 6 and the second doped polysilicon layer 9 and by another contact between the side surfaces of the first doped polysilicon layer 5 and the second doped polysilicon layer 9 in the opening 8A.

To reduce the contact resistance between the first and second polycide leads 4 and 12, each of the doped polysilicon layers 5 and 9 is doped with phosphorus.

Attention should be paid to the fact that since the opening 8A is wider than the first polycide lead 4 and spaces are formed between the first polycide lead 4 and the side surfaces of the interlayer insulating film 7, the first and second doped polycide leads 5 and 9 are in contact with each other at the side surfaces of the first polycide lead 4. Since the first and second polycide leads 4 and 12 are connected to each other through contact between the first and second doped polysilicon layers 5 and 9, phosphorus atoms do not move between the first and second doped polysilicon layers 5 and 9, when the difference in phosphorus concentration between the first and second doped polysilicon layers 5 and 9 is made small. Therefore, the contact resistance remains low.

Accordingly, the contact resistance between the first and second polycide leads 4 and 12 in this structure can be made smaller than that in the structure of the conventional semiconductor device shown in FIG. 9.

Further, in the structure of the conventional semiconductor device of FIG. 10, both of the interlayer insulating film 7 and the first tungsten silicide layer 6 need to be etched in forming the opening 8. In contrast, in the structure of FIG. 2, the opening 8A may be formed by etching only the interlayer insulating film 7. Therefore, according to this embodiment, the semiconductor device can be manufactured easily at a low cost.

As described above, in this embodiment, the width of the opening that is formed in connecting the second polycide lead to the first polycide lead is set larger than that of the first polycide lead. Therefore, the first and second polycide leads can be connected to each other with a substantially low contact resistance. Further, since the opening can be formed by etching only the interlayer insulating film, the etching step is simplified whereby the semiconductor device can be manufactured easily at a low cost.

Second Embodiment

Figure 3:
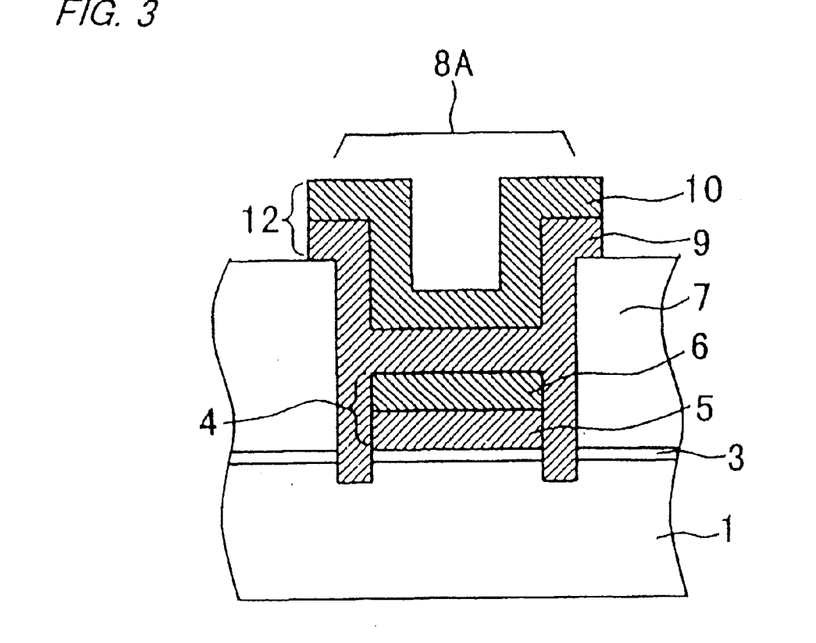
FIG. 3 is a sectional view to show a comparative example of a semiconductor device.

In the structure of the semiconductor device according to the first embodiment, suppose the underlying insulating film 2 is not formed, and the gate insulating film 3 and the interlayer insulating film 7 are both made of oxide films. In that case, the opening 8A may reach the silicon substrate 1 as shown in FIG. 3, and causes a possibility that the second polycide lead 12 is short-circuited with the silicon substrate 1.

Figure 4:
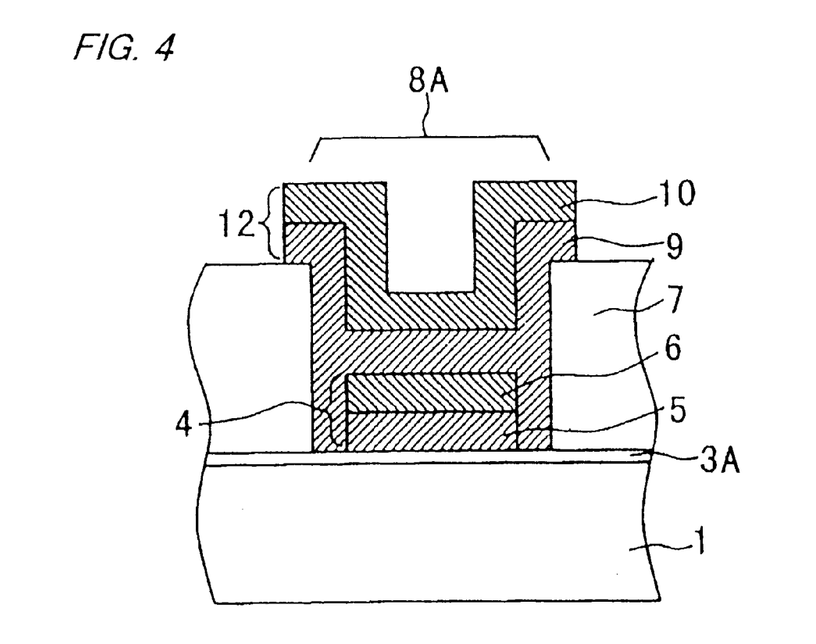
FIG. 4 is a sectional view showing a semiconductor device according to a second embodiment of the present invention.

A second embodiment is intended to solve the above problem. In the second embodiment, in the above-mentioned case, the gate insulating film 3, such as a silicon oxide file, is replaced by a gate insulating film 3A made of SiON (or SiN), and in forming the opening 8A the interlayer insulating film 7 is etched by using a process that has a large etching selection ratio of an oxide film to a SiON film (or a SiN film), such as plasma etching with a carbon fluoride type gas.

In this manner, as shown in FIG. 4, the short-circuiting between the silicon substrate 1 and the second polycide lead 12 can be avoided.

As described above, according to this embodiment, the silicon substrate 1 and the second polycide lead 12 are not short-circuited with each other, even where the underlying insulating film is not formed and the interlayer insulating film is made of an silicon oxide film, because the gate insulating film is made of SiON (or SiN) and a process having a large etching selection ratio of an oxide film to a SiON film (or a SiN film) is used in forming the opening.

Third Embodiment

Figure 5:
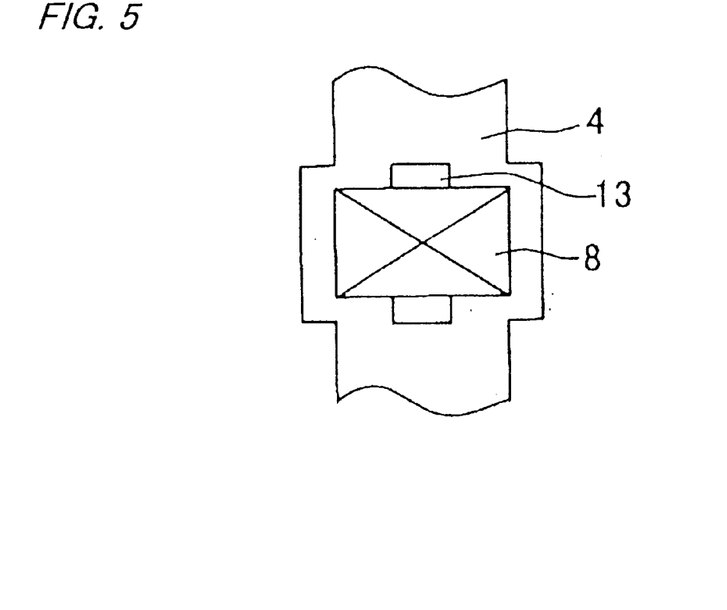
FIGS. 5 and 6 are a plan view and a sectional view, respectively, showing a semiconductor device according to a third embodiment of the present invention.
Figure 6:
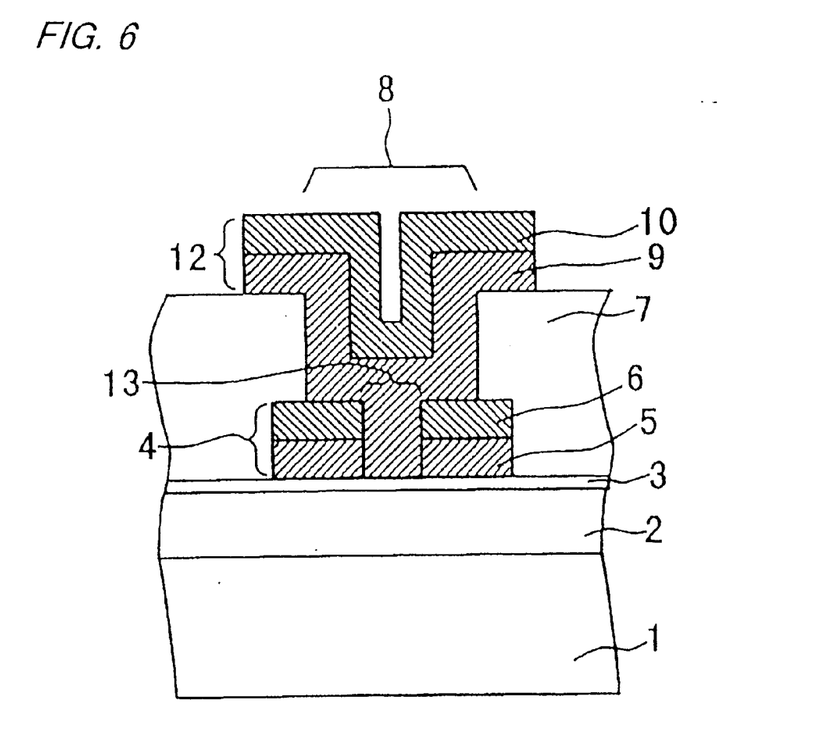

FIGS. 5 and 6 are a plan view and a sectional view, respectively, showing a semiconductor device according to a third embodiment of the present invention. The same or corresponding portions in FIGS. 5 and 6 and FIGS. 1 and 2 are given the same reference numerals, and detailed descriptions therefor will be omitted.

This embodiment is the same as the first embodiment in that an underlying insulating film 2 is formed on a silicon substrate 1, a gate insulating film 3 is formed on the underlying insulating film 2, and a first polycide lead 4 is formed on the gate insulating film 3. However, this embodiment is different from the first embodiment in that a through-hole 13 as a second opening that reaches the gate insulating film 3 is formed at a central position of the first polycide lead 4 when the first polycide lead 4 is formed.

Then, after an interlayer insulating film 7 is formed on the gate insulating film 3 so as to cover the first polycide lead 4, an opening 8 as a first opening that reaches the top surface of the first tungsten silicide layer 6 of the first polycide lead 4 and a through-hole 13 as the second opening are formed by etching the interlayer insulating film 7.

Then, a second polycide lead 12 is connected to the first polycide lead 4 through the first opening 8 and the second opening 13. Specifically, <the first and second polycide leads 4 and 12 are connected to each other in such a manner that>a part of the top surface of the first tungsten silicide layer 6 contacts the second doped polysilicon layer 9 in the opening 8, and the side surfaces of the first tungsten silicide layer 6 and the first doped polysilicon layer 5 contact the second doped polysilicon layer 9 in the second opening 13.

That is, the first and second doped polysilicon layers 5 and 9 are in contact with each other at the side surfaces of the first polycide lead 4 in the second opening 13.

Also in this case, since the first and second polycide leads 4 and 12 are connected to each other through contact between the first and second doped polysilicon layers 5 and 9, phosphorus atoms do not move between the first and second doped polysilicon layers 5 and 9 when the difference in phosphorus concentration between the first and second doped polysilicon layers 5 and 9 is made small. Therefore, the contact resistance remains low.

Accordingly, also in this structure, the contact resistance between the first and second polycide leads 4 and 12 can be made lower than that of the structure of the conventional semiconductor device shown in FIG. 9.

Further, since the opening 8 can be formed by etching only the interlayer insulating film 7, the semiconductor device can be manufactured easily at a low cost.

As described above, in this embodiment, the through-hole is formed at a central position of the first polycide lead in addition to the opening formed in the interlayer insulating film in connecting the second polycide lead to the first polycide lead. Therefore, the first and second polycide leads can be connected to each other with a substantially low contact resistance. Further, since the opening can be formed by etching only the interlayer insulating film, the etching step is simplified whereby the semiconductor device can be manufactured easily at a low cost. In addition, since the through-hole can be formed at the same time as the first polycide lead is formed, the cost remains the same as in the case of the conventional structure.

Also in this embodiment, the problem, that the second polycide lead may be short-circuited with the silicon substrate when the underlying insulating film is omitted, can be solved in the same manner as described in the second embodiment.

Fourth Embodiment

Figure 7:
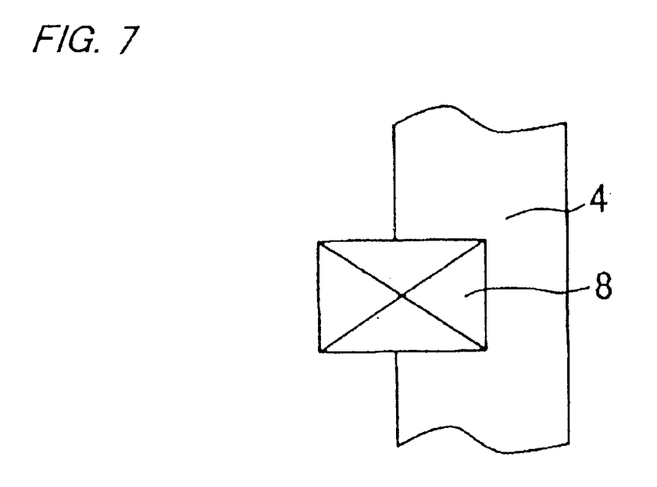
FIGS. 7 and 8 are a plan view and a sectional view, respectively, showing a semiconductor device according to a fourth embodiment of the present invention.
Figure 8:
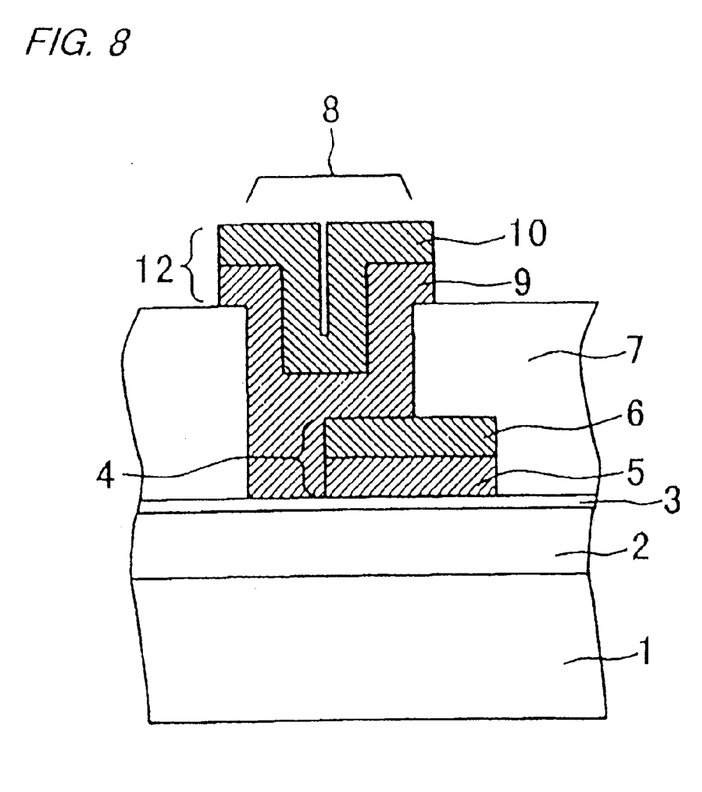

FIGS. 7 and 8 are a plan view and a sectional view, respectively, showing a semiconductor device according to a fourth embodiment of the present invention. The same or corresponding portions in FIGS. 7 and 8 and FIGS. 1 and 2 are given the same reference numerals, and detailed descriptions therefor will be omitted.

This embodiment is the same as the above embodiments in that an underlying insulating film 2 is formed on a silicon substrate 1, a gate insulating film 3 is formed on the underlying insulating film 2, a first polycide lead 4 is formed on the gate insulating film 3, and after an interlayer insulating film 7 is formed on the gate insulating film 3 so as to cover the first polycide lead 4, an opening 8 is formed through the interlayer insulating film 7. However, this embodiment is different from the above embodiments in that the opening 8 is formed to deviate to one side of the first polycide lead 4.

As a result, the first and second doped polysilicon layers 5 and 9 are in contact with each other at the side surface of the first polycide lead 4.

Also in this case, since the first and second polycide leads 4 and 12 are connected to each other through contact between the first and second doped polysilicon layers 5 and 9, phosphorus atoms do not move between the first and second doped polysilicon layers 5 and 9 when the difference in phosphorus concentration between the first and second doped polysilicon layers 5 and 9 is made small. Therefore, the contact resistance remains low.

Accordingly, also in this structure, the contact resistance between the first and second polycide leads 4 and 12 can be made lower than that of the structure of the conventional semiconductor device shown in FIG. 9.

Further, since the opening 8 can be formed by etching only the interlayer insulating film 7, the semiconductor device can be manufactured easily at a low cost.

As described above, in this embodiment, in connecting the second polycide lead to the first polycide lead, the opening is formed in the interlayer insulating film to deviate partially from the first. Therefore, the first and second polycide leads can be connected to each other with low contact resistance. Further, since the opening can be formed by etching only the interlayer insulating film, the etching step is simplified, whereby the semiconductor device can be manufactured easily at a low cost.

Also in this embodiment, the problem, that the second polycide lead may be short-circuited with the silicon substrate when the underlying insulating film is omitted, can be solved in the same manner as described in the second embodiment.

Although each of the above embodiments is directed to the case where the doped polysilicon layer is used as a silicon layer, the invention is not limited to such a case, and other kinds of silicon layers such as a doped amorphous silicon layer may be used as long as they provide similar advantages to those described above.

Although each of the above embodiments is directed to the case where the tungsten silicide layer is used as a metal silicide layer, the invention is not limited to such a case. For example, any of the metal films such as a titanium nitride film, a tungsten film, and a composite film thereof may be used as long as they provide similar advantages to those described above.

The effects and advantages of the present invention may be summarized as follows.

As described above, in one aspect of the present invention, in a semiconductor device, a first lead is formed on an underlying layer or on a semiconductor substrate and comprises a plurality of wiring layers. An interlayer insulating film is formed on the semiconductor substrate, and an opening is formed to reach at least a bottom layer of the plurality of wiring layers of the first lead. A second lead is formed on the insulating film and comprises a plurality of wiring layers. The second lead is connected with the first lead in the opening. In the opening, a bottom layer of the plurality of wiring layers of the second lead is in contact with the bottom layer of the plurality of wiring layers of the first lead at a side surface of the first lead. According to this structure of a semiconductor device, the contact resistance between the first and second lead can be reduced, whereby the signal transmission speed can be increased.

In another aspect, in the above semiconductor device, the opening of the insulating film may be wider than the first lead. In this case, the first and second leads can be connected to each other with low contact resistance. Since the opening can be formed by etching only the insulating film, the etching process can be simplified and the semiconductor device can be manufactured easily at a low cost.

In another aspect, in the above semiconductor device, the opening of the insulating film may consist of a first opening that extends in the interlayer insulating film to a top layer of the plurality of wiring layers of the first lead and a second opening that extends from the first opening to the bottom layer of the plurality of wiring layers of the first lead. In this case, the first and second interconnections can be connected to each other with low contact resistance. Since the opening can be formed by etching only the insulating film, the etching process can be simplified and the semiconductor device can be manufactured easily at a low cost.

In another aspect, In the semiconductor device, the opening of the insulating film may be formed to partially deviate from the first lead. In this case, the first and second leads can be connected to each other with a low contact resistance. Since the opening can be formed by etching only the insulating film, the etching process can be simplified and the semiconductor device can be manufactured easily at a low cost.

In another aspect, in the semiconductor device, the plurality of wiring layers of the first lead may be a first silicon layer and a first metal silicide layer formed on the first silicon layer. The plurality of wiring layers of the second lead may be a second silicon layer and a second metal silicide layer formed on the second silicon layer. In this case, the first and second leads can be connected to each other with a low contact resistance by bringing the first and second silicon layers into contact with each other.

Each of the above-mentioned first and second silicon layers may be a doped polysilicon layer. In this case, having high heat resistance, each of the first and second silicon layers can withstand a high-temperature heat treatment.

Each of the above-mentioned first and second silicon layers may be a doped amorphous silicon layer. In this case too, having high heat resistance, each of the first and second silicon layers can withstand a high-temperature heat treatment.

In another aspect, in the semiconductor device, the plurality of wiring layers of the first lead may be a first silicon layer and a first metal layer formed on the first silicon layer. The plurality of wiring layers of the second lead may be a second silicon layer and a second metal layer formed on the second silicon layer. In this case, having a high heat resistance, each of the first and second metal layers can withstand a high-temperature heat treatment.

In another aspect, the above semiconductor devices may further comprise a SiN film or a SiON film under the first lead. In this case, the opening that is formed in the insulating film does not reach the semiconductor substrate, whereby short-circuiting between the semiconductor substrate and the second lead can be prevented.

In another aspect, the above-mentioned SiN film or the SiON film may be a gate insulating film. In this case, even where no underlying insulating film is used and the insulating film through which the opening is formed is an oxide film, the opening does not reach the semiconductor substrate, whereby short-circuiting between the semiconductor substrate and the second lead can be prevented.

In another aspect, the present invention also provides a manufacturing method of a semiconductor device. In the method, a first lead, comprising a plurality of wiring layers, is formed on an underlying layer or on a semiconductor substrate. An interlayer insulating film is formed so as to cover the first lead. An opening is formed through the interlayer insulating film so that the opening reaches a bottom layer of the plurality of wiring layers of the first lead. A second lead is formed and connected with the first lead in the opening. In this manufacturing method, since the opening can be formed by etching only the insulating film, the etching process can be simplified and the semiconductor device can be manufactured easily at a low cost.

In another aspect, in the above manufacturing method, the opening may be wider than the first lead. In this case, the etching process can be simplified. Further, the second lead can be brought into contact with the side surfaces of the first lead in a reliable manner, and the first and second leads can be connected to each other with low contact resistance.

In another aspect, in the above manufacturing method, a through-hole may be formed through the first lead at its central position when the first lead is formed. In this case, the opening that is formed through the insulating film reaches the bottom layer of the first lead. Therefore, the second lead can be brought into contact with the side surfaces of the first lead in a reliable manner, and the first and second leads can be connected to each other with low contact resistance. Further, the etching process can be simplified.

In another aspect, in the above manufacturing method, the opening may be formed in the insulating layer to partially deviate from the first. In this case, the second lead can be brought into contact with the side surfaces of the first lead in a reliable manner, and the first and second leads can be connected to each other with low contact resistance. Further, the etching process can be simplified.

In another aspect, in the above manufacturing method, an insulating film of SiN film or a SiON film is formed under the first lead. Then, the opening may be formed with a large etching selection ratio of an oxide film to a SiN film or a SiON film. In this case, even where no underlying insulating film is used and the interlayer insulating film through which the opening is formed is an oxide film, the opening does not reach the semiconductor substrate, whereby short-circuiting between the semiconductor substrate and the second lead can be prevented.

It is further understood that the foregoing description is a preferred embodiment of the disclosed device and that various changes and modifications may be made in the invention without departing from the spirit and scope thereof.

We claim:

1. A semiconductor device comprising:
   a semiconductor substrate;
   a first lead formed on said semiconductor substrate and comprising a plurality of wiring layers including a bottom layer and a top layer;
   an interlayer insulating film formed on said semiconductor substrate;
   an opening formed in said interlayer insulating film, extending from an upper surface of said interlayer insulating film to at least said bottom layer of said first lead, and exposing at least one side surface and a portion of an upper surface of said first lead; and
   a second lead formed on said interlayer insulating film and comprising a plurality of wiring layers including a bottom layer and a top layer, wherein said second lead is in contact with said first lead in said opening,
   wherein, in said opening, said bottom layer of said second lead is in contact with said bottom layer of said first lead at a side surface of said first lead.

2. The semiconductor device according to claim 1, wherein said opening of said interlayer insulating film is wider than said first lead.

3. The semiconductor device according to claim 1, wherein said opening of said interlayer insulating film includes a first opening extending from said upper surface of said interlayer insulating film to said top layer of said first lead and a second opening extending from said first opening to said bottom layer of said first lead.

4. The semiconductor device according to claim 1, wherein said interlayer insulating film covers one side surface and a portion of said upper portion of said first lead.

5. The semiconductor device according to claim 1, wherein the plurality of wiring layers of said first lead include a first silicon layer and a first metal silicide layer formed on said first silicon layer, and wherein the plurality of wiring layers of said second lead include a second silicon layer and a second metal silicide layer formed on said second silicon layer.

6. The semiconductor device according to claim 1, further comprising a SiN film or a SiON film formed between said first lead and said semiconductor substrate.

7. The semiconductor device according to claim 5, wherein each of said first and second silicon layers is a doped polysilicon layer.

8. The semiconductor device according to claim 5, wherein each of said first and second silicon layers is a doped amorphous silicon layer.

9. The semiconductor device according to claim 5, wherein the plurality of wiring layers of said first lead include a first silicon layer and a first metal layer formed on said first silicon layer, and wherein the plurality of wiring layers of said second lead include a second silicon layer and a second metal layer formed on said second silicon layer.

10. The semiconductor device according to claim 9, wherein said SiN film or said SiON film is a gate insulating film.

11. A semiconductor device comprising:
    a semiconductor substrate;
    a first lead formed on said semiconductor substrate and comprising a plurality of wiring layers including a bottom layer and a top layer;
    an interlayer insulating film formed on said semiconductor substrate;
    an opening formed in said interlayer insulating film, extending from an upper surface of said interlayer insulating film to at least said bottom layer of said first lead, and exposing at least one side surface and a portion of an upper surface of said first lead; and
    a second lead formed on said interlayer insulating film, and being in contact with said first lead in said opening,
    wherein, in said opening, said second lead is in contact with said bottom layer of said first lead at a side surface of said first lead.

12. The semiconductor device according to claim 11, wherein said opening is wider than said first lead.

13. The semiconductor device according to claim 11, wherein said opening includes a first opening extending from said upper surface of said interlayer insulating film to said top layer of said first lead, and a second opening extending from said first opening to said bottom layer of said first lead.

14. The semiconductor device according to claim 11, wherein said interlayer insulating film covers one side surface and a portion of said first lead.

15. The semiconductor device according to claim 11, wherein said bottom layer of said first lead includes a first silicon layer.

16. The semiconductor device according to claim 11, further comprising a SiN film or a SiON film formed between said first lead and said semiconductor substrate.

17. The semiconductor device according to claim 15, wherein said second lead includes a second silicon layer.

18. The semiconductor device according to claim 15, wherein said top layer of said first lead includes a metal silicide layer.

19. The semiconductor device according to claim 15, wherein said top layer of said first lead includes a metal layer.

20. The semiconductor device according to claim 17, wherein each of said first and second silicon layers is a doped polysilicon layer or a doped amorphous silicon layer.

* * * * *